US009853103B2

(12) United States Patent
Pan et al.

(10) Patent No.: US 9,853,103 B2
(45) Date of Patent: Dec. 26, 2017

(54) PINCHED DOPED WELL FOR A JUNCTION FIELD EFFECT TRANSISTOR (JFET) ISOLATED FROM THE SUBSTRATE

(71) Applicant: Cirrus Logic International Semiconductor Ltd., Edinburgh (GB)

(72) Inventors: Shanjen Pan, Austin, TX (US); Marc L. Tarabbia, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/093,574

(22) Filed: Apr. 7, 2016

(65) Prior Publication Data
US 2017/0294512 A1 Oct. 12, 2017

(51) Int. Cl.
*H01L 29/84* (2006.01)
*H01L 29/10* (2006.01)
*H01L 29/808* (2006.01)
*H01L 29/66* (2006.01)
*B81B 3/00* (2006.01)

(52) U.S. Cl.
CPC ........ *H01L 29/1083* (2013.01); *B81B 3/0027* (2013.01); *H01L 29/66901* (2013.01); *H01L 29/808* (2013.01); *B81B 2201/0257* (2013.01); *B81B 2203/0127* (2013.01); *B81B 2207/015* (2013.01)

(58) Field of Classification Search
CPC ....... B82Y 10/00; B82Y 40/00; H01L 29/165; H01L 29/78; H01L 29/6653; H01L 29/66636; H01L 27/1203; H01L 29/7848; H01L 21/84; H01L 29/1033; G11C 16/0483; G11C 16/10; G11C 11/406; G11C 11/4074
See application file for complete search history.

(56) References Cited

U.S. PATENT DOCUMENTS

| 2008/0128762 | A1  | 6/2008  | Vora |
| 2008/0272408 | A1  | 11/2008 | Vora |
| 2010/0271133 | A1  | 10/2010 | Bracale et al. |
| 2014/0037113 | A1* | 2/2014  | David .................... H03F 3/187 381/120 |
| 2014/0332857 | A1* | 11/2014 | Chen ................. H01L 29/42316 257/265 |
| 2015/0214384 | A1  | 7/2015  | Shepard et al. |

FOREIGN PATENT DOCUMENTS

JP          2011101304 A    5/2011

* cited by examiner

*Primary Examiner* — Robert Bachner
(74) *Attorney, Agent, or Firm* — Norton Rose Fulbright US LLP (57) ABSTRACT

A JFET structure may be formed such that the channel region is isolated from the substrate to reduce parasitic capacitance. For example, instead of using a deep well as part of a gate structure for the JFET, the deep well may be used as an isolation region from the surrounding substrate. As a result, the channel in the JFET may be pinched laterally between doped regions located between the source and the drain of the JFET. In other example embodiments, the channel may be pinched vertically and the isolation between the JFET structure and the substrate is maintained. A JFET structure with improved isolation from the substrate may be employed in some embodiments as a low-noise amplifier. In particular, the low-noise amplifier may be coupled to small signal devices, such as microelectromechanical systems (MEMS)-based microphones.

33 Claims, 7 Drawing Sheets

PINCHED DOPED WELL FOR A JUNCTION FIELD EFFECT TRANSISTOR (JFET) ISOLATED FROM THE SUBSTRATE

FIELD OF THE DISCLOSURE

The instant disclosure relates to semiconductor structures for electronic devices. More specifically, portions of this disclosure relate to semiconductor structures for a junction field effect transistor (JFET) and methods of manufacturing the same.

BACKGROUND

Field effect transistors (FETs), and other transistors, are electronic components commonly used to build electronic devices. For example, amplifiers, memory, and processors all are made up of several to several million transistors. Thus, a transistor's performance is largely a determining factor in the success of the electronic devices built from those transistors. Improvements in the underlying transistors can reduce noise in amplifiers, improve density and thus capacity in memory, and improve processing speed in processors.

A junction field effect transistor (JFET) is one particular kind of transistor. A JFET generally includes three terminals: a source, a drain, and a gate. By properly operating these three terminals, the JFET can be used as an amplifier in one configuration or in other circuitry in other configurations. In one mode of operation, current flows from the source to the drain through a channel of the JFET, but application of a reverse bias to the gate terminal can cause pinching of the channel and a reduction in the current flow from the source to the drain. One conventional JFET structure is shown in FIG. 1.

Figure 1:
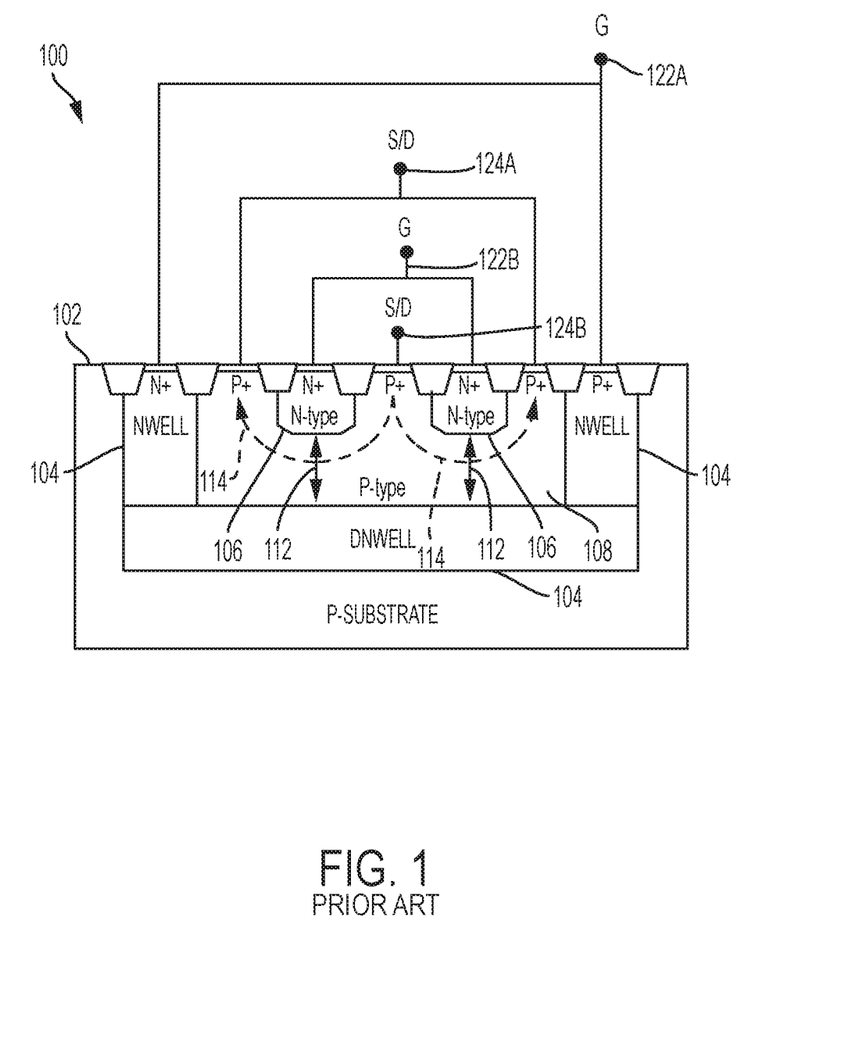
FIG. 1 is an example cross-section view illustrating a conventional JFET structure according to the prior art.

FIG. 1 is an example cross-section view illustrating a conventional JFET structure according to the prior art. A JFET 100 may include an n-doped well 104 in a p-doped substrate 102. A n-doped region 106 may be formed inside a p-doped region 108 within the n-doped well 104. Gate terminals 122A and 122B may be coupled to the n-doped well 104 and the n-doped region 106. A source terminal 124A may be coupled to one point of the p-doped region 108, and a drain terminal 124B may be coupled to another point of the p-doped region 108. Current flows through path 114 from the source terminal 124A to the drain terminal 124B. The path 114 may be pinched by applying a reverse bias to the gate terminals 122A and 122B, which constricts the path 114 along profile 112. Thus, current through the path 114, and thus the JFET 100, may be reduced by the application of a reverse bias at the gate terminals 122A and 122B.

The conventional JFET of FIG. 1 vertically pinches the current path between the n-doped region 106 and the n-doped well 104. However, this results in a junction capacitance around the n-doped well 104 to the substrate 102, which adds a parasitic capacitance between the gate terminals 122A and 122B and the substrate 102. The parasitic capacitance can cause undesirable behavior in the JFET 100. For example, parasitic capacitance can cause undesirable characteristics at high-frequency operation, such as by creating undesirable resonances with other components of the electronic device.

Shortcomings mentioned here are only representative and are included simply to highlight that a need exists for improved electrical components, particularly for transistors used in circuitry, such as amplifiers, employed in consumer-level devices, such as mobile phones. Embodiments described herein address certain shortcomings but not necessarily each and every one described here or known in the art.

SUMMARY

A FET structure, such as for a junction field effect transistor (JFET), may be formed such that the channel region is isolated from the substrate to reduce parasitic capacitance. For example, instead of using a deep well as part of a gate structure for the JFET, the deep well may be used as an isolation region from the surrounding substrate. As a result, the channel in the JFET may be pinched laterally between doped regions located between the source and the drain of the JFET. In other example embodiments, the channel may be pinched vertically and the isolation between the JFET structure and the substrate is maintained. A JFET structure with improved isolation from the substrate may be employed in some embodiments as a low-noise amplifier. In particular, the low-noise amplifier may be coupled to small signal devices, such as microelectromechanical systems (MEMS)-based microphones.

According to one embodiment, a field-effect transistor (FET) structure may include a pinched doped well, wherein the pinched doped well is doped with a first type of dopant and/or an oppositely-doped region surrounding the pinched doped well such that the FET structure is isolated from a surrounding material, wherein the oppositely-doped region is doped with a second type of dopant having an opposite polarity of the first type of dopant. The surrounding material may be a substrate, such that the FET structure is isolated from the substrate and such that a voltage bias of the FET structure is independent from a voltage bias of the substrate. Such a FET structure may be configured as a component of an amplifier, wherein the amplifier is coupled to a microelectromechanical system (MEMS) microphone and configured to amplify audio signals received by the MEMS microphone.

In certain embodiments, the pinched-doped well may be laterally-pinched. In these embodiments, the pinched doped well may include a first doped well surrounding a second and a third doped well, wherein the first doped well comprises the first type of dopant, wherein the second and third doped wells are doped with an opposite polarity dopant than the first doped well, and wherein a channel through the FET structure is laterally pinched by the second and third doped wells; and the FET structure may further include a gate electrode coupled to the second and third doped wells, a source/drain electrode coupled to the first doped well, and/or an isolation electrode coupled to the oppositely-doped region. In an embodiment having a laterally-pinched channel, the FET structure may have a p-doped channel when the first doped well is a p-type doped well, the second doped well is an n-type doped well, the third doped well is an n-type doped well, and the oppositely-doped region is an n-type doped region. In other embodiments having a laterally-pinched channel, the FET structure may have an n-doped channel by inverting the doping polarity of the wells just described.

In certain embodiments, the pinched-doped well may be vertically-pinched. In these embodiments, the pinched doped well may include a first doped well surrounding a second doped well, wherein the first doped well comprises the first type of dopant, wherein the second doped well is doped with an opposite polarity from the first doped well, and wherein a channel through the FET structure is vertically pinched between the second doped well and the oppositely-doped region; and the FET structure may further include a gate electrode coupled to the second doped well and the oppositely-doped region, and/or a source/drain electrode coupled to the first doped well. In an embodiment having a laterally-pinched channel, the FET structure may have a p-doped channel when the first doped region is p-type doped, the second doped region is n-type doped, and the oppositely-doped region is n-type doped. In other embodiments having a laterally-pinched channel, the FET structure may have an n-doped channel by inverting the doping polarity of the wells just described.

According to another embodiment, a method of manufacturing a field effect transistor (FET) may include forming a pinched doped well, wherein the pinched doped well is doped with a first type of dopant, and/or forming an oppositely-doped region surrounding the pinched doped well such that the FET structure is isolated from a surrounding material, wherein the oppositely-doped region is doped with a second type of dopant having an opposite polarity of the first type of dopant.

In some embodiments, the forming of the pinched doped well may include forming a laterally-pinched doped well having a first doped well surrounding a second and a third doped well, wherein the second and third doped wells are doped with an opposite polarity dopant than the first doped well, and wherein a channel through the FET structure is laterally pinched by the second and third doped wells; the forming of the first doped well may include forming a p-type doped well, forming the second doped well comprises forming an n-type doped well, forming the third doped well comprising forming an n-type doped well, and/or forming the oppositely-doped region comprises forming an n-type doped well; the forming of the pinched doped well may include forming a vertically-pinched doped well having a first doped well surrounding a second doped well, wherein the second doped well is doped with an opposite polarity from the first doped well, and wherein a channel through the FET structure is vertically pinched between the second doped well and the oppositely-doped region; and/or the forming of the first doped region may include forming a p-type doped region, forming the second doped region comprises forming an n-type doped region, and forming the oppositely-doped region comprises forming an n-type doped region.

In certain embodiments, the method of manufacturing may further include forming a gate electrode coupled to the second and third doped wells; forming a source/drain electrode coupled to the first doped well; forming a gate electrode coupled to the second doped well and the oppositely-doped region; and/or forming a source/drain electrode coupled to the first doped well.

According to another embodiment, a microelectromechanical system (MEMS) microphone package may include an acoustic port configured to receive ambient sounds; a diaphragm acoustically coupled to the acoustic port and configured to convert the ambient sounds to electronic signals; and/or an amplifier coupled to the diaphragm and configured to process the electronic signals. The amplifier may include one or more field effect transistors (FETs), at least one of the one or more FETs including any of the FET structures described above or herein, such as a FET structure including a pinched doped well, wherein the pinched doped well is doped with a first type of dopant and/or an oppositely-doped region surrounding the pinched doped well such that the FET structure is isolated from a surrounding material, wherein the oppositely-doped region is doped with a second type of dopant having an opposite polarity of the first type of dopant.

In certain embodiments, the surrounding material may be a substrate, such that the FET structure is isolated from the substrate and such that a voltage bias of the FET structure is independent from a voltage bias of the substrate; the pinched doped well may be laterally-pinched, and wherein the pinched doped well comprises a first doped well surrounding a second and a third doped well, wherein the first doped well comprises the first type of dopant, wherein the second and third doped wells are doped with an opposite polarity dopant than the first doped well, and wherein a channel through the FET structure is laterally pinched by the second and third doped wells; the first doped well may be a p-type doped well, the second doped well may be an n-type doped well, the third doped well may be an n-type doped well, and the oppositely-doped region may be an n-type doped region; the pinched doped well may be vertically-pinched, and wherein the pinched doped well includes a first doped well surrounding a second doped well, wherein the second doped well may be doped with an opposite polarity from the first doped well, and wherein a channel through the FET structure may be vertically pinched between the second doped well and the oppositely-doped region; and/or the first doped region may be p-type doped, the second doped region may be n-type doped, and the oppositely-doped region may be n-type doped.

In some embodiments, the microelectromechanical system (MEMS) microphone package may further include a gate electrode coupled to the second and third doped wells; a source/drain electrode coupled to the first doped well; a gate electrode coupled to the second doped well and the oppositely-doped region; and/or a source/drain electrode coupled to the first doped well.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2A:
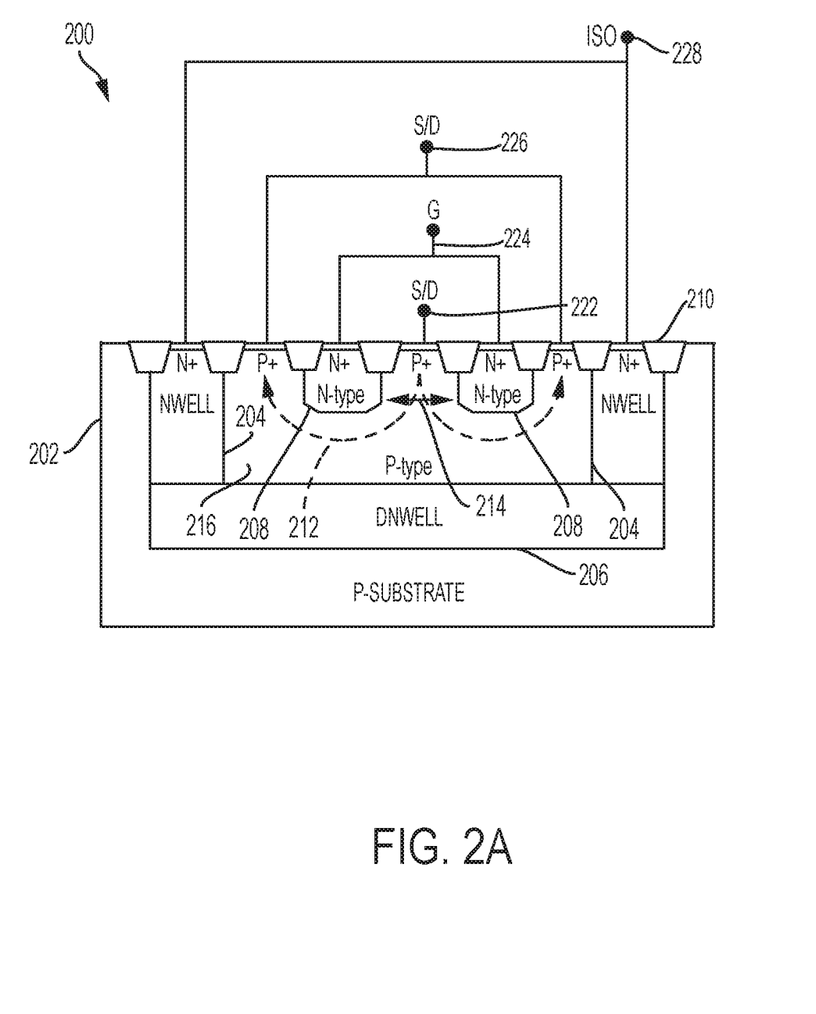
FIG. 2A is an example cross-section view illustrating a JFET structure with isolation from the substrate and a laterally-pinched channel according to one embodiment of the disclosure.

Additional embodiments of a field effect transistor (FET) structure with channel pinched between doped wells with isolation from surrounding materials are described in further detail below. FIG. 2A is an example cross-section view illustrating a JFET structure with isolation from the substrate and a laterally-pinched channel according to one embodiment of the disclosure. A FET structure 200 may be formed in a substrate 202 that is p-doped. The FET structure 200 may include a deep well 206 that is n-doped and buried in a layer of the substrate 202. Wells 204 may have a similar doping as the deep well 206 and form an isolation region bounded by the wells 204 laterally on the sides of a p-doped portion 216 and the deep well 206 vertically in a lower layer of the substrate 202 than the p-doped portion 216. The wells 204 and deep well 206 may have an opposite polarity of doping of the substrate 202. Although the FET structure 200 will be further described based on a p-doped substrate 202, a similar FET structure may be constructed on an n-doped substrate when other polarities throughout the FET structure 200 are likewise inverted. An isolation (ISO) contact 228 may be coupled to the wells 204, and voltages applied from circuitry (not shown) external to the FET structure 200 to apply a bias to the isolation region and the body of the transistor in the FET structure 200. An enhanced doped region may be located near a contact point between the isolation contact 228 and the wells 204. For example, when the wells 204 are n-doped, then an enhanced contact region of n+-doping may be located at a surface of the substrate 202 within the wells 204. In one embodiment, shallow trench isolation (STI) regions 210 may be present between some of the regions of the FET structure 200.

Within the isolation region is a portion 216, a pinched doped well, of the substrate 202 that has a doping concentration equal or approximately equal that of substrate 202. The portion 216 may be isolated from surrounding material including the substrate 202 and other components formed within the substrate 202. The portion 216 may provide the channel for electrical current through the FET structure 200. For example, current flow may proceed along path 212 through the FET structure 200. Source and drain contacts 222 and 226 may be coupled to the portion 216 to complete a current loop through another portion of circuitry (not shown). Generally, either contact 222 or 226 be used as a source or a drain. An enhanced doped region may be located near a contact point between the source and drain contacts 222 and 226 and the portion 216. For example, when the portion 216 is p-doped, then an enhanced contact region of p+-doping may be located at a surface of the substrate 202 within the portion 216.

Figure 2B:
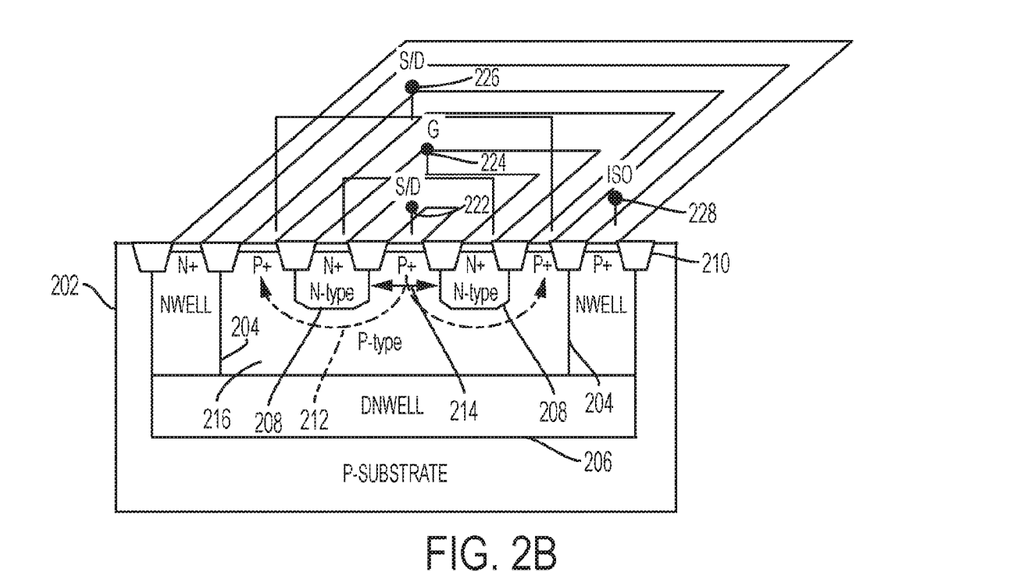
FIG. 2B is an example perspective view illustrating a JFET structure with isolation from the substrate and a laterally-pinched channel according to one embodiment of the disclosure.
Figure 2C:
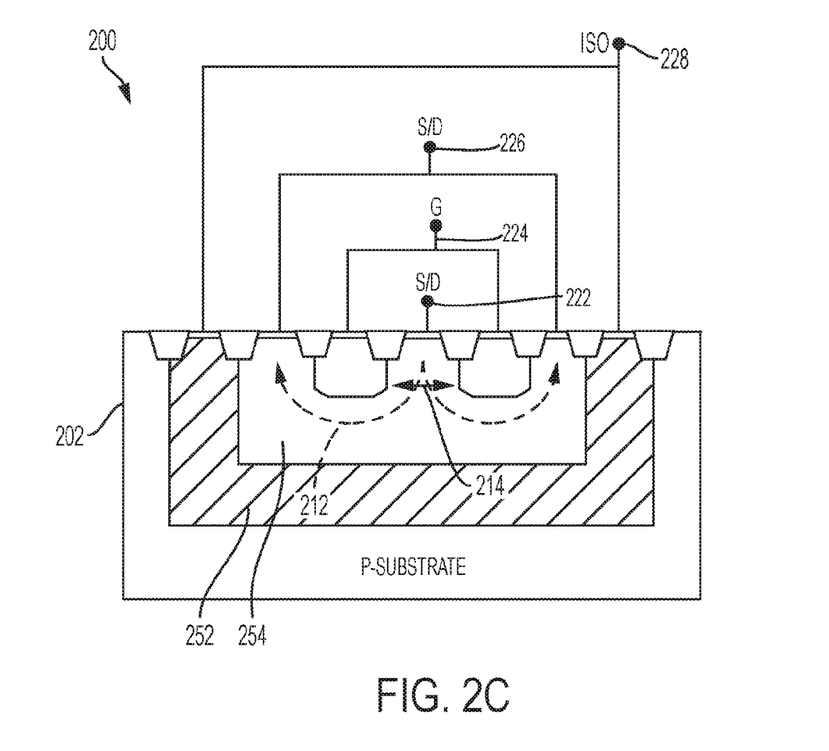
FIG. 2C is an example cross-section view illustrating a JFET structure with isolation from the substrate and a laterally-pinched channel with the isolation structure highlighted according to one embodiment of the disclosure.

The isolation region and pinched doped well regions are highlighted in FIG. 2C. FIG. 2C is an example cross-section view illustrating a JFET structure with isolation from the substrate and a laterally-pinched channel with the isolation structure highlighted according to one embodiment of the disclosure. The FET structure 200 is shown with an isolation region 252 surrounding a pinched doped well 254. Within the pinched doped well 254, current flows between source and drain along path 212. The current flow may be constricted along profile 214 by applying a voltage to the gate contact 224.

Additionally, within the isolation region 216 may be gate structures 208. The gate structures 208 may have an opposite doping polarity of the isolation region 216. A profile 214 between the gate structures 208 may cause pinching of current flow through the FET structure 200. For example, as a reverse bias is applied to the gate structures 208 carrier concentrations change along the profile 214 that cause current flow 212 to be restricted to a narrower portion between the gate structures 208. A gate contact 224 may be coupled to the gate structures 208. Circuitry (not shown) external to the FET structure 200 may be coupled to the gate contact 224 to control current flow through the FET structure 200, such as by applying varying levels of reverse bias to the gate structure 208 to constrict or expand a current path through a pinched region of the FET structure 200 and vary a resistance of the FET structure 200. That is, the current flow 212 through the FET structure 200 may be laterally pinched as it flows through profile 214. An enhanced doped region may be located near a contact point between the gate contact 224 and the gate structures 208. For example, when the gate structures 208 are n-doped, then an enhanced contact region of n+-doping may be located at a surface of the substrate 202 within the gate structures 208.

The FET structure 200 is shown in a perspective view in FIG. 2B. FIG. 2B is an example perspective view illustrating a JFET structure with isolation from the substrate and a laterally-pinched channel according to one embodiment of the disclosure. The channel of the FET structure 200 is laterally pinched between the gate structures 208 when an applied voltage causes carriers from the gate structures 208 to restrict the current channel between the gate structures 208. Here, the gate structures 208 are shown as a rectangular structure around a center source/drain contact region to the portion 216. An outer source/drain contact region is shown as a rectangular structure around the gate structures 208. Although rectangular structures are shown in FIG. 2B, other shapes can be used for the FET structure 200, such as circles, ovals, or squares.

Figure 3A:
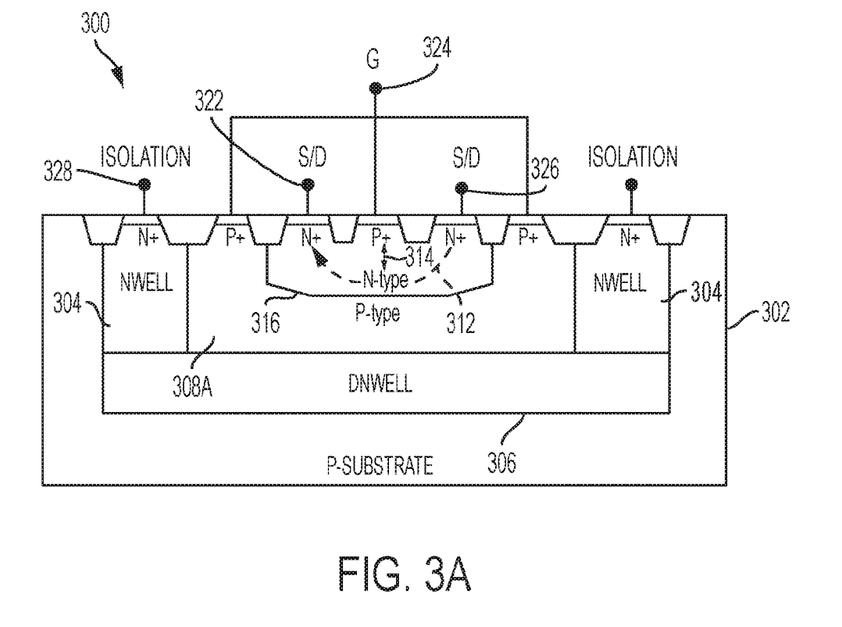
FIG. 3A is an example cross-section view illustrating a JFET structure with isolation from the substrate and a vertically-pinched channel according to one embodiment of the disclosure.

The gate structures 208 of FIG. 2A and FIG. 2B are positioned within the portion 216 of the substrate 202 to laterally pinch a current flow 212 through the FET structure 200. Similar FET structures may be used to vertically pinch current flow through a FET structure and also provide isolation for the FET structure. FIG. 3A illustrates one such FET structure. FIG. 3A is an example cross-section view illustrating a JFET structure with isolation from the substrate and a vertically-pinched channel according to one embodiment of the disclosure. A FET structure 300 in a substrate 302 may include a deep well 306 buried in the substrate 302. Wells 304 may be formed in the substrate 302 to form an isolation region containing a portion 308A, inside of which is doped region 316, a pinched doped well of the substrate 302. The portion 308A may be isolated from surrounding material including the substrate 302 and other components formed within the substrate 302. The portion 308A may act as a gate, along with doped region 308, and be coupled through a gate contact 324 to circuitry (not shown) external to the FET structure 300. Source and drain contacts 322 and 326 may couple the doped region 316 to circuitry (not shown) external to the FET structure 300. The external circuitry coupled to source and drain contacts 322 and 326 may complete a current loop for current flowing through the FET structure 300 along path 312, and that current flow controlled through the gate contact 324. The external circuitry may also apply a bias to the doped regions 308 and 308A to change a profile of carrier concentrations along the profile 314 to constrict or expand a channel for the current flow 312. The channel for current flow 312 is constricted or expanded when the application of voltage to gate contact 324 and source and drain contacts 322 and 326 causes carriers to move in vertical direction approximately perpendicular to the surface of the substrates 302. By applying a bias to the gate structure 308, the external circuitry can vertically constrict current flow 312 through the FET structure 300. Further, isolation contacts 328 may be coupled to the wells 304 and deep well 306 to control isolation of the FET structure 300 from surrounding material and components.

Figure 3B:
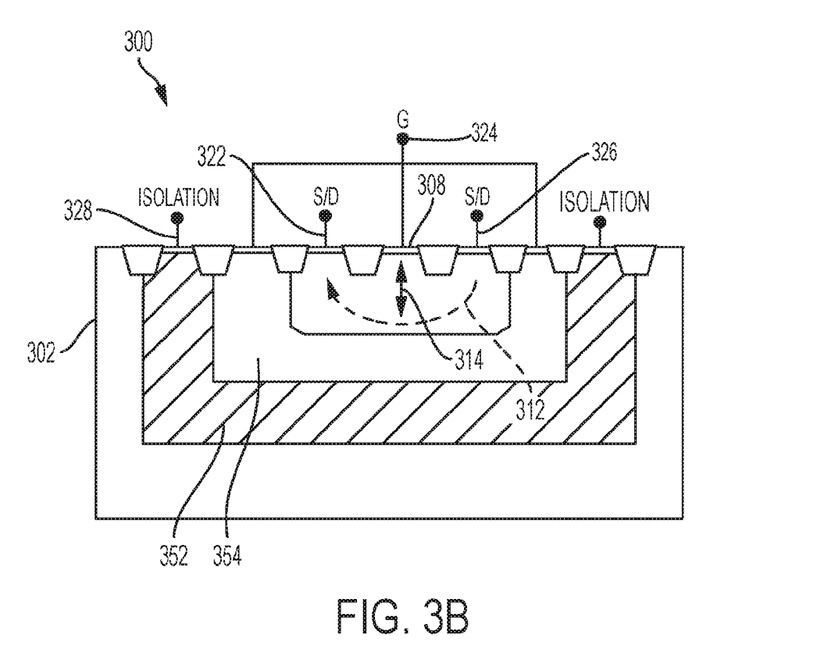
FIG. 3B is an example cross-section view illustrating a JFET structure with isolation from the substrate and a vertically-pinched channel with the isolation structure highlighted according to one embodiment of the disclosure.

The isolation region and pinched doped well regions are highlighted in FIG. 3B. FIG. 3B is an example cross-section view illustrating a JFET structure with isolation from the substrate and a vertically-pinched channel with the isolation structure highlighted according to one embodiment of the disclosure. The FET structure 300 is shown with an isolation region 352 surrounding a pinched doped well 354. Within the pinched doped well 254, current flows between source and drain along path 312. The current flow may be constricted along profile 314 by applying a voltage to the gate contact 324.

Figure 4:
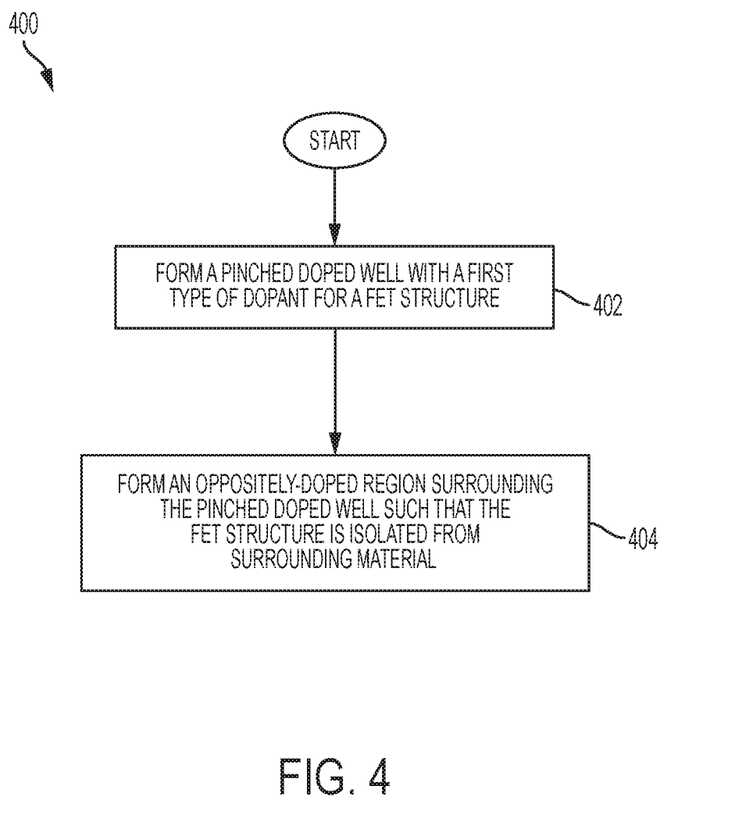
FIG. 4 is an example flow chart illustrating a method of semiconductor manufacturing for a JFET structure with isolation from the substrate according to one embodiment of the disclosure.
Figure 5:
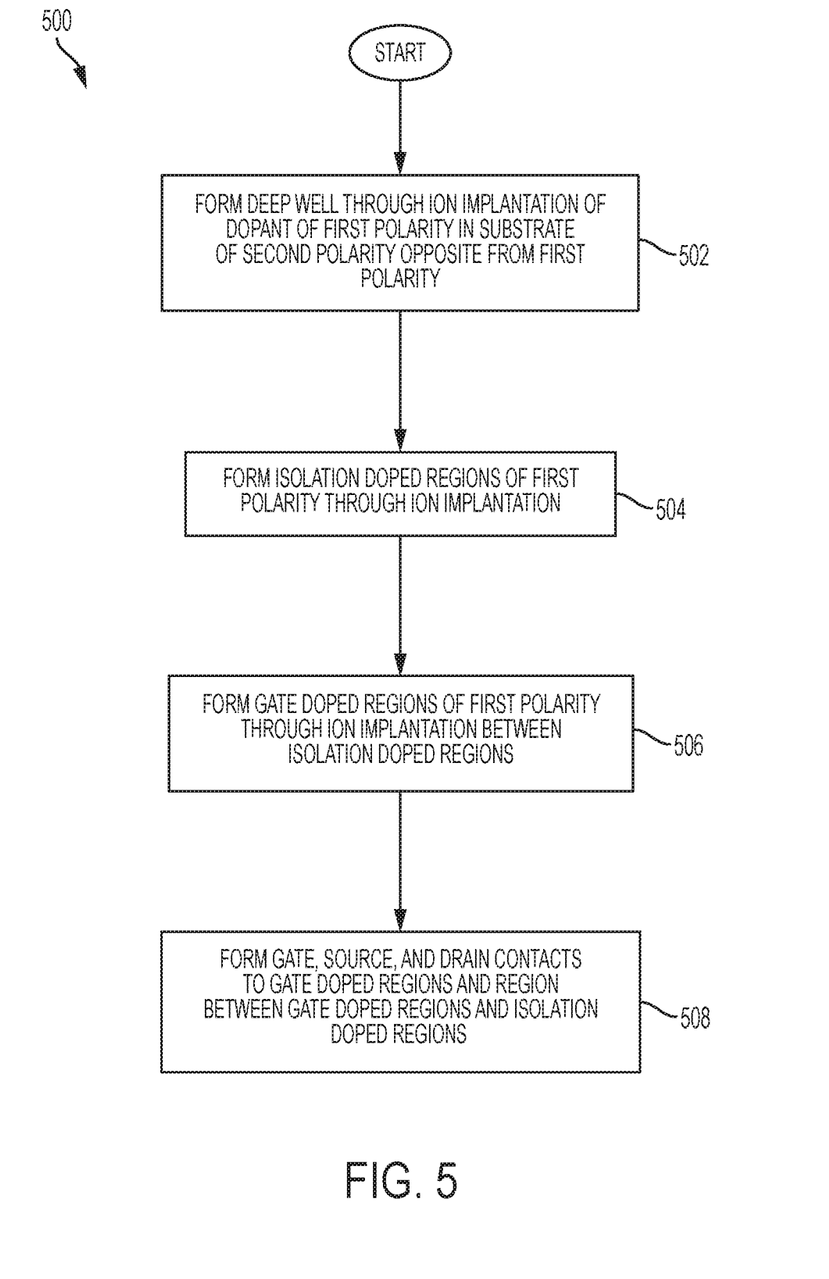
FIG. 5 is an example flow chart illustrating a method of semiconductor manufacturing for a JFET structure by ion implantation of doped regions in the JFET structure according to one embodiment of the disclosure.

The FET structures described above may be manufactured according to a semiconductor manufacturing flow illustrated in FIG. 4 or FIG. 5 or any other appropriate semiconductor manufacturing flow. FIG. 4 is an example flow chart illustrating a method of semiconductor manufacturing for a JFET structure with isolation from the substrate according to one embodiment of the disclosure. A method 400 begins at block 402 with forming a pinched doped well with a first type of dopant for a FET structure. Then, at block 404, an oppositely-doped region is formed surrounding the pinched doped well such that the FET structure is isolated from surrounding material.

Another semiconductor manufacturing flow for forming FET structures is shown in FIG. 5. FIG. 5 is an example flow chart illustrating a method of semiconductor manufacturing for a JFET structure by ion implantation of doped regions in the JFET structure according to one embodiment of the disclosure. A method 500 begins at block 502 with forming a deep well through ion implantation of dopant of a first polarity in a substrate of a second polarity opposite from the first polarity. Block 502 may include forming buried layers such as deep well 206 of FIG. 2A and FIG. 2B and deep well 306 of FIG. 3. Then, at block 504, isolation doped regions of a first polarity may be formed through ion implantation into the substrate. Block 504 may include forming wells 204 of FIG. 2A and FIG. 2B and wells 304 of FIG. 3. Next, at block 506, gate doped regions may be formed between isolation doped regions through ion implantation having a first polarity. Block 506 may include forming gate structures 208 of FIG. 2A and FIG. 2B and gate structure 308 of FIG. 3. The ion implantation of blocks 602, 604, and/or 606 may be performed by depositing an appropriate mask for each ion implantation step on the substrate and implanting ions in the substrate through openings in the mask, where the mask may be removed after the ion implantation process is complete. Then, at block 508, gate, source, drain, and/or isolation contacts may be formed to the gate doped regions, regions surrounding the gate doped region, and isolation regions. Block 608 may include forming contacts 222, 224, 226, and/or 228 of FIG. 2A and FIG. 2B and contacts 322, 324, and/or 326 of FIG. 3. The contacts may be formed by deposition of conducting material, such as metals, on the substrates, including performing physical evaporation, physical sputtering, chemical vapor deposition (CVD), and/or electroplating.

The FET structures described above and/or manufacturing according to the processes described above may be used in electronic circuits and included in electronic devices. For example, the FET structures may be used in low-noise amplifiers, where the isolation of the FET structures from surrounding material can reduce noise in the amplifier. Such a low-noise amplifier may be beneficial in many electronic circuits, such as microelectromechanical system (MEMS) sensors. In particular, a low-noise amplifier that includes a FET structure may be coupled to a MEMS microphone. In some embodiments, the low-noise amplifier including the FET structure may be packaged with the MEMS microphone. That package may then be included in electronic devices, such as mobile phones and personal media players.

Figure 6:
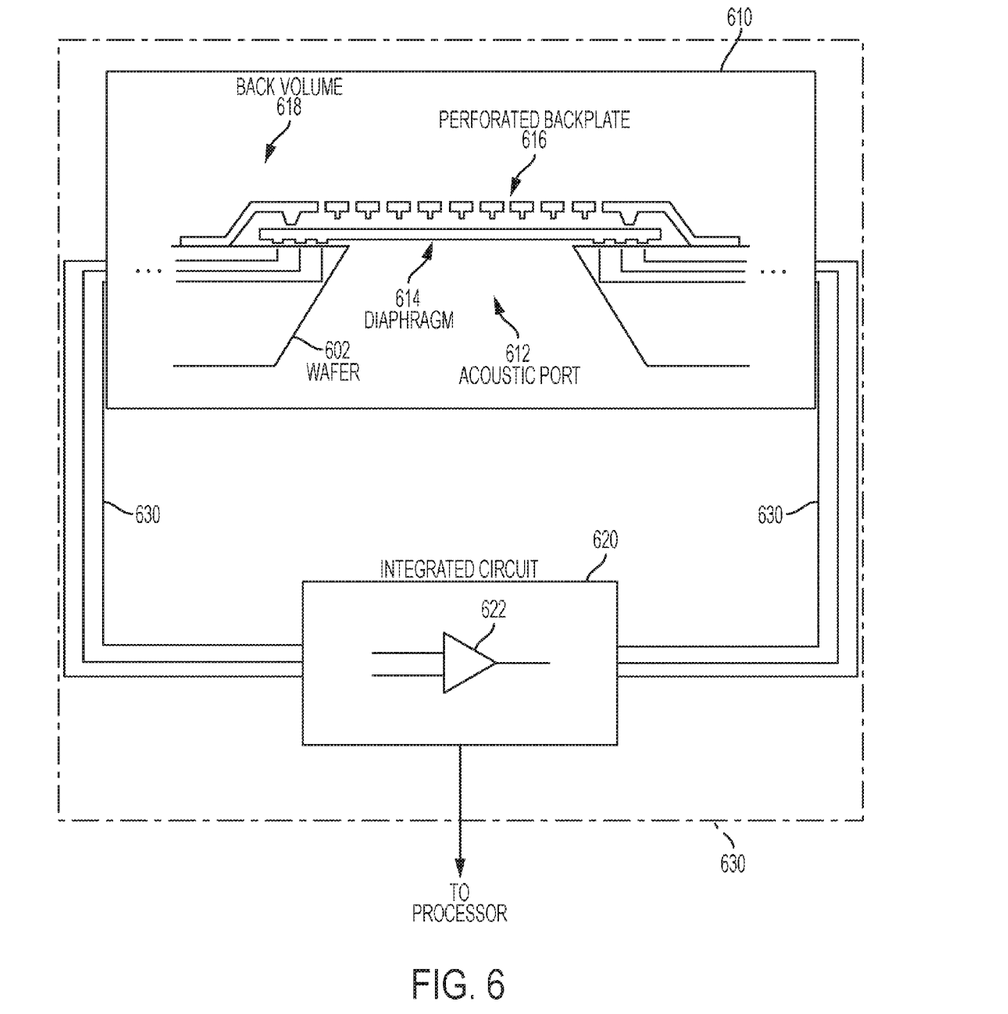
FIG. 6 is an example block diagram of an apparatus incorporating a JFET structure with isolation from the substrate according to one embodiment of the disclosure.

One example of such a package is shown in FIG. 6. FIG. 6 is an example block diagram of an apparatus incorporating a JFET structure with isolation from the substrate according to one embodiment of the disclosure. A package 630 may include a MEMS microphone 610. The MEMS microphone 610 may include an acoustic port 612 in a wafer 602 that receives audio from an environment around the microphone 610. The audio may be represented as varying air pressure levels that are detected by the microphone 610 and converted into electrical signals. The sounds entering the acoustic port 612 reach a diaphragm 614 that modulates based on the varying air pressure levels and converts the sounds to electronic signals transmitted through transmission lines 630. The MEMS microphone 610 may also include a perforated backplate 616 that may mechanically support the diaphragm 614 and a back volume 618 that may protect the fragile diaphragm during turbulent motion that may occur when dropping a mobile phone on the ground. The transmission lines 630 transmit electrical signals corresponding to audio to an integrated circuit 620 for processing the signals. The signals may have a low amplitude and a low signal-to-noise ratio (SNR) that presents challenges when processing the signals. However, when an amplifier 622 of the integrated circuit 620 is a low-noise amplifier incorporating the FET structures described above and their isolation capability, the signals may be processed and the signal quality improved before transmitting the processed audio signals to a processor. The processor may then further process the signals and/or store the audio data for later playback.

The schematic flow chart diagram of FIG. 4 and FIG. 5 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although p-doped channel devices or n-doped channel devices are described throughout the detailed description, aspects of the invention may be applied to the design of either n-doped channel devices or p-doped channel devices, such as by appropriately inverting the doping polarity of certain regions. The FET structures described above may be used in electronic circuitry that includes transistor components, such as memory, processors, logic circuitry, switches, and variable resistors. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A field-effect transistor (FET) structure, comprising:
   a pinched doped well, wherein the pinched doped well is doped with a first type of dopant;
   an oppositely-doped region surrounding the pinched doped well such that the FET structure is isolated from a surrounding material, wherein the oppositely-doped region is doped with a second type of dopant having an opposite polarity of the first type of dopant,
   wherein the surrounding material is a substrate, such that the FET structure is isolated from the substrate and such that a voltage bias of the FET structure is independent from a voltage bias of the substrate; and
   an isolation electrode coupled to the oppositely-doped region.

2. The FET structure of claim 1, wherein the pinched doped well is laterally-pinched.

3. The FET structure of claim 2, wherein the pinched doped well comprises a first doped well surrounding a second and a third doped well, wherein the first doped well comprises the first type of dopant, wherein the second and third doped wells are doped with an opposite polarity dopant than the first doped well, and wherein a channel through the FET structure is laterally pinched by the second and third doped wells.

4. The FET structure of claim 3, further comprising:
   a gate electrode coupled to the second and third doped wells; and
   a source/drain electrode coupled to the first doped well.

5. The FET structure of claim 3, wherein the first doped well is a p-type doped well, the second doped well is an n-type doped well, the third doped well is an n-type doped well, and the oppositely-doped region is an n-type doped region.

6. The FET structure of claim 1, wherein the pinched doped well is vertically-pinched.

7. The FET structure of claim 6, wherein the pinched doped well comprises a first doped well surrounding a second doped well, wherein the first doped well comprises the first type of dopant, wherein the second doped well is doped with an opposite polarity from the first doped well, and wherein a channel through the FET structure is vertically pinched between the second doped well and the oppositely-doped region.

8. The FET structure of claim 7, further comprising:
   a gate electrode coupled to the second doped well and the oppositely-doped region; and
   a source/drain electrode coupled to the first doped well.

9. The FET structure of claim 7, wherein the first doped region is p-type doped, the second doped region is n-type doped, and the oppositely-doped region is n-type doped.

10. The FET structure of claim 1, wherein the oppositely-doped region surrounding the pinched doped well comprises a deep well buried in a substrate having the pinched doped well and the oppositely-doped region.

11. The FET structure of claim 1, wherein the FET structure is configured as a component of an amplifier.

12. The FET structure of claim 11, wherein the amplifier is coupled to a microelectromechanical system (MEMS) microphone and configured to amplify audio signals received by the MEMS microphone.

13. A method of manufacturing a field effect transistor (FET) structure, comprising:
   forming a pinched doped well, wherein the pinched doped well is doped with a first type of dopant;
   forming an oppositely-doped region surrounding the pinched doped well such that the FET structure is isolated from a surrounding material, wherein the oppositely-doped region is doped with a second type of dopant having an opposite polarity of the first type of dopant; and
   forming an isolation electrode coupled to the oppositely-doped region such that the FET structure is isolated from a substrate and such that a voltage bias of the FET structure is independent from a voltage bias of the substrate.

14. The method of claim 13, wherein forming the pinched doped well comprises forming a laterally-pinched doped well comprising a first doped well surrounding a second and a third doped well, wherein the second and third doped wells are doped with an opposite polarity dopant than the first doped well, and wherein a channel through the FET structure is laterally pinched by the second and third doped wells.

15. The method of claim 14, further comprising:
   forming a gate electrode coupled to the second and third doped wells; and
   forming a source/drain electrode coupled to the first doped well.

16. The method of claim 14, wherein forming the first doped well comprising forming a p-type doped well, forming the second doped well comprises forming an n-type doped well, forming the third doped well comprising forming an n-type doped well, and forming the oppositely-doped region comprises forming an n-type doped well.

17. The method of claim 13, wherein forming the pinched doped well comprises forming a vertically-pinched doped well comprising a first doped well surrounding a second doped well, wherein the second doped well is doped with an opposite polarity from the first doped well, and wherein a channel through the FET structure is vertically pinched between the second doped well and the oppositely-doped region.

18. The method of claim 17, further comprising:
forming a gate electrode coupled to the second doped well and the oppositely-doped region; and
forming a source/drain electrode coupled to the first doped well.

19. The method of claim 18, wherein forming the first doped region comprises forming a p-type doped region, forming the second doped region comprises forming an n-type doped region, and forming the oppositely-doped region comprises forming an n-type doped region.

20. The method of claim 13, wherein forming an oppositely-doped region comprises forming a deep well in a substrate comprising the oppositely-doped region and the pinched doped well.

21. A semiconductor device, comprising:
a substrate comprising dopant of a first polarity;
a deep well comprising dopant of a second polarity opposite from the first polarity, wherein the deep well is buried in the substrate; and
lateral wells in the substrate that extend from the deep well to approximately a top of the substrate, wherein the lateral wells comprise dopant of the second polarity,
wherein the lateral wells and the deep well isolate a portion of the substrate from a remainder of the substrate, and
wherein the isolated portion of the substrate comprises a channel of a field effect transistor (FET).

22. The semiconductor device of claim 21, wherein the isolated portion comprises gate structures comprising dopant of the second polarity that laterally pinches current through the channel.

23. The semiconductor device of claim 22, further comprising:
an isolation contact coupled to the lateral wells;
a gate contact coupled to the gate structures; and
one or more source and drain contacts coupled to the isolated portion of the substrate.

24. The semiconductor device of claim 21, wherein the isolated portion comprises a pinched doped well comprising dopant of the second polarity that vertically pinches current through the channel.

25. The semiconductor device of claim 24, further comprising:
an isolation contact coupled to the lateral walls;
a first gate contact portion in the pinched doped well, wherein the first gate contact portion comprises dopant of the first polarity;
a first gate contact coupled to the first gate contact portion;
a second gate contact coupled to the isolated portion of the substrate; and
one or more source and drain contacts coupled to the pinched doped well.

26. A microelectromechanical system (MEMS) microphone package, comprising:
an acoustic port configured to receive ambient sounds;
a diaphragm acoustically coupled to the acoustic port and configured to convert the ambient sounds to electronic signals; and
an amplifier coupled to the diaphragm and configured to process the electronic signals, wherein the amplifier comprises one or more field effect transistors (FETs), at least one of the one or more FETs comprising:
a pinched doped well, wherein the pinched doped well is doped with a first type of dopant; and
an oppositely-doped region surrounding the pinched doped well such that the FET structure is isolated from a surrounding material, wherein the oppositely-doped region is doped with a second type of dopant having an opposite polarity of the first type of dopant.

27. The apparatus of claim 26, wherein the surrounding material is a substrate, such that the FET structure is isolated from the substrate and such that a voltage bias of the FET structure is independent from a voltage bias of the substrate.

28. The apparatus of claim 26, wherein the pinched doped well is laterally-pinched, and wherein the pinched doped well comprises a first doped well surrounding a second and a third doped well, wherein the first doped well comprises the first type of dopant, wherein the second and third doped wells are doped with an opposite polarity dopant than the first doped well, and wherein a channel through the FET structure is laterally pinched by the second and third doped wells.

29. The apparatus of claim 28, further comprising:
a gate electrode coupled to the second and third doped wells; and
a source/drain electrode coupled to the first doped well.

30. The apparatus of claim 28, wherein the first doped well is a p-type doped well, the second doped well is an n-type doped well, the third doped well is an n-type doped well, and the oppositely-doped region is an n-type doped region.

31. The apparatus of claim 26, wherein the pinched doped well is vertically-pinched, and wherein the pinched doped well comprises a first doped well surrounding a second doped well, wherein the second doped well is doped with an opposite polarity from the first doped well, and wherein a channel through the FET structure is vertically pinched between the second doped well and the oppositely-doped region.

32. The apparatus of claim 31, further comprising:
a gate electrode coupled to the second doped well and the oppositely-doped region; and
a source/drain electrode coupled to the first doped well.

33. The apparatus of claim 31, wherein the first doped region is p-type doped, the second doped region is n-type doped, and the oppositely-doped region is n-type doped.

* * * * *